United States Patent
Eng et al.

(10) Patent No.: US 6,420,782 B1
(45) Date of Patent: Jul. 16, 2002

(54) VERTICAL BALL GRID ARRAY INTEGRATED CIRCUIT PACKAGE

(75) Inventors: Kian Teng Eng; Lee Teck Yeow, both of Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/478,917

(22) Filed: Jan. 6, 2000

Related U.S. Application Data (62) Division of application No. 09/115,565, filed on Jul. 14, 1998.

(51) Int. Cl.$^7$ .............................................. H01L 23/02
(52) U.S. Cl. ...................................... 257/686; 257/777
(58) Field of Search ................................ 257/686, 685, 257/777

(56) References Cited

U.S. PATENT DOCUMENTS

| | | | |
|---|---|---|---|
| 3,179,913 A | 4/1965 | Mittler et al. | 339/18 |
| 3,370,203 A | 2/1968 | Kravitz et al. | 317/101 |
| 3,459,998 A | 8/1969 | Focarile | 317/100 |
| 3,904,934 A | 9/1975 | Martin | 317/101 |
| 4,288,841 A | 9/1981 | Gogal | 361/414 |
| 4,502,098 A | 2/1985 | Brown et al. | 361/383 |
| 4,574,331 A | 3/1986 | Smolley | 361/393 |
| 4,646,128 A | 2/1987 | Carson et al. | 357/74 |
| 4,727,410 A | 2/1988 | Higgins, III | 357/74 |
| 4,823,233 A | 4/1989 | Brown et al. | 361/383 |
| 4,833,568 A | 5/1989 | Berhold | 361/383 |
| 4,862,249 A | 8/1989 | Carlson | 357/80 |
| 4,868,712 A | 9/1989 | Woodman | 361/388 |
| 4,953,005 A | 8/1990 | Carlson et al. | 357/80 |
| 5,016,138 A | 5/1991 | Woodman | 361/381 |
| 5,019,945 A | 5/1991 | Smolley | 361/412 |
| 5,107,328 A | * 4/1992 | Kinsman | 257/686 |
| 5,786,628 A | * 7/1998 | Beilstein, Jr. | 257/604 |
| 5,798,571 A | 8/1998 | Nakajima | 257/784 |
| 5,956,236 A | * 9/1999 | Corisis et al. | 361/783 |
| 6,005,776 A | * 12/1999 | Holman et al. | 257/686 |
| 6,196,443 B1 | * 3/2001 | DiGiacomo | 228/254 |
| 6,198,164 B1 | * 3/2001 | Choi et al. | 257/723 |

* cited by examiner

Primary Examiner—Roy Potter
(74) Attorney, Agent, or Firm—Wade James Brady, III; Frederick J. Telecky, Jr.

(57) ABSTRACT

An integrated circuit package (30, 32) for vertical attachment as part of a high density module (200) comprising a carrier (70) having an opening (86), routing strips (82), conduits (84) and side surface terminals (100), the side surface terminals (100) disposed on a side surface (92), which side surface is common to the carrier (70) and the integrated circuit package 30, 32. An adhesive layer (60), which attaches a silicon chip (50) to a carrier (70), wire bonding (80) electrically connecting the silicon chip (50) to the routing strips (82) and potting material (90) filling the opening (86), are also disclosed.

7 Claims, 3 Drawing Sheets

VERTICAL BALL GRID ARRAY INTEGRATED CIRCUIT PACKAGE

This is a Divisional Application of Ser. No. 09/115,565 filed Jul. 14, 1998.

TECHNICAL FIELD OF THE INVENTION

The present invention relates in general to the field of integrated circuit packaging, and more specifically, can relate to an apparatus and method for creating substantially vertically mountable integrated circuit packages that can be electrically connected to a circuit board by a lateral ball grid array.

BACKGROUND OF THE INVENTION

Without limiting the scope of the invention, its background is described connection with memory modules, as an example.

Heretofore, in this field, integrated circuits have been formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are generally packaging related.

The integrated circuit must be packaged in a suitable medium that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to a lead frame, where, following wire bonding and encapsulation designated parts of the lead frame become the terminals of the package. The, packaging of integrated circuits has also involved the placement of chips on a surface where, following adhesion of the chip to the surface and wire bonding, an encapsulant is placed over the chip to seal and protect the chip and other components.

SUMMARY OF THE INVENTION

Commonly, integrated circuit packages are attached to other components to form a module. Memory chip packages, e.g., are mounted on a board to form a single inline memory module (SIMM). SIMMs may, for example, be used to increase the memory of typically personal computers. As memory demands increase, so has the need for increased Input/Output (I/O) capacity and memory capacity of memory module. Efforts to enhance these capacities, however, have been limited by the amount of surface space available on the SIMM surface. Space may also be limited in the environment in which SIMMs operate. Furthermore, the surface area occupied by the individual memory units limits both the distance between connection, but also, the number of memory units that may be positioned on a single mother or sister-board.

Therefore, it is recognized herein that a need has arisen for increasing the density of memory and other semiconductor circuits on each mother or sister-board and that a need has also arisen for a process for producing high density arrangements that provide for the close proximity of integrated circuit packages to reduce interconnect distance, and that a need has arisen for materials and methods that lead to increases in I/O and/or memory capacity. Further, a need has arisen for an integrated circuit package that provides protection to the wire bonding and silicon chip during subsequent manufacturing and testing steps and from the environment of its intended purpose.

The present invention disclosed herein includes a high density integrated circuit module and a process for producing such a module that provides for vertical alignment of integrated circuit packages. The packaging also protects the components of the integrated circuit package during manufacturing and testing steps and from the environment of its intended purpose. The individual integrated circuit packages can be angle-mounted on a circuit board, with the packages adjacent (e.g., parallel) to each other and attached to either or both sides of the circuit board to form a module.

The invention can include an integrated circuit package comprising a carrier having a top surface and a terminal mounted flat on the surface of a side. The side and the side surface terminal are generally at an angle to the top surface. In one embodiment the side surface is generally perpendicular to the top surface. The side, however, can be at an angle from 30 to 90 degrees (but preferably at least 45) relative to the top surface.

The carrier can be a circuit board type of material, such as a high temperature epoxy resin, and has one or more routing strips that are integral to the carrier. Integral to the carrier means that the routing strips can be within or on the surfaces of the carrier. One or more terminals are disposed on a side surface of the carrier, with at least one of the pads being electrically connected with at least one of the routing strips. A chip, such as a silicon chip, is adhered to the carrier, the chip having one or more bonding pads. Wire bonding may electrically connect the one or more bonding pads to at least one of the routing strips and potting material may fill the opening within the carrier to cover the wire bonding and the bonding pads.

In one embodiment of the present invention the integrated circuit package further. comprises at least one solder ball disposed on at least one of the side surface terminals disposed on the carrier. The carrier and the package have a common side, and the side surface terminals are on this common side. Thus, the terminals are on the side of both the carrier and the package. Potting material may also encapsulate the chip and have a thickness of, for example, about 6 mils. The carrier for use with this embodiment will typically have a thickness of at least about 10 mils, depending on the size of the solder ball connection. In one embodiment of the present invention the overall thickness or profile of the package is between about 40 mils and 50 mils. In yet other embodiments the thickness of the package is about 41, 44, 47 or 50 mils.

Yet another embodiment of the present invention is a high density memory module comprising a horizontal circuit board and at least one vertical integrated circuit package having side-mounted bonding pads electrically connected to the circuit board. The high density module may further comprise a plurality of tabs being integral with the top or the bottom of the circuit board. The high density module may further comprise solder balls disposed between the integrated circuit package and the carrier.

Yet another embodiment of the present invention is a high density module produced by a process comprising the steps of, obtaining a circuit board having a top and a bottom and electrically connecting at least one vertical integrated circuit package to the top of the circuit board. The process may further including the step of electrically and perpendicularly connecting at least one integrated circuit package to the bottom of the circuit board. The present invention may also include the step of disposing at least one solder ball between at least one terminal of the integrated circuit package and at least one tab on the top of the circuit board. Alternatively, solder columns may be disposed is between the integrated circuit module and the first side of the carrier.

In one embodiment, the chip is adhered to a carrier and has bonding pads disposed thereon. Wire bonding electrically connects the bonding pads to the routing strips. A potting material in the opening provides protection to the wire bonding.

The integrated circuit package can further include bus bars being integral with the carriers and extending into the openings. The bus bar electrically connects at least one of the bonding pads of the chip to at least one the terminals disposed on the first and the second surfaces of the carrier.

The integrated circuit module is formed by electrically connecting at least one or the side surface terminals of the integrated circuit package with at least one tab disposed on the top surface of a mother or sister-circuit board. In one embodiment, solder balls are used to make the electrical connection between the one or more integrated circuit packages on the mother or sister-circuit board. In another embodiment, solder columns can be used to make the electrical connection between the integrated circuit package and the circuit board.

The integrated circuit module may further include additional integrated circuit packages angularly mounted and electrically connected to the mother or sister-board, for example, two or more integrated circuit packages may be perpendicular mounted and electrically connected to the mother or sister-circuit board.

Even though the invention is sometimes described herein in terms of the integrated circuit packages being perpendicularly (or vertically mounted with regard to a horizontal circuit board) for simplicity and convenience, it is to be understood that the integrated circuit packages may be angularly attached to the circuit board in a manner that is not substantially perpendicular to the board surface. In fact, the attachment of the individual integrated circuit packages to a mother or sister-circuit board may be at angles of less that 90 degrees, such as 45 or even 30 degrees depending, e.g., on the space constraints under which the integrated circuit must operate.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using or various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention can be related to integrated circuits using a board-on-chip design to enable a plurality of integrated circuit packages to be vertically (or perpendicularly) attached and electrically connected to at least one side of a circuit board to form a SIMM. By vertically connecting the integrated circuit packages to a mother or sister board the present invention addresses the need for high speed performance that also meets the space constraint requirements of modern semiconductors. The principles of the present invention may be incorporated into, for example, a synchronous DRAM (SDRAM) silicon chip.

Figure 1:
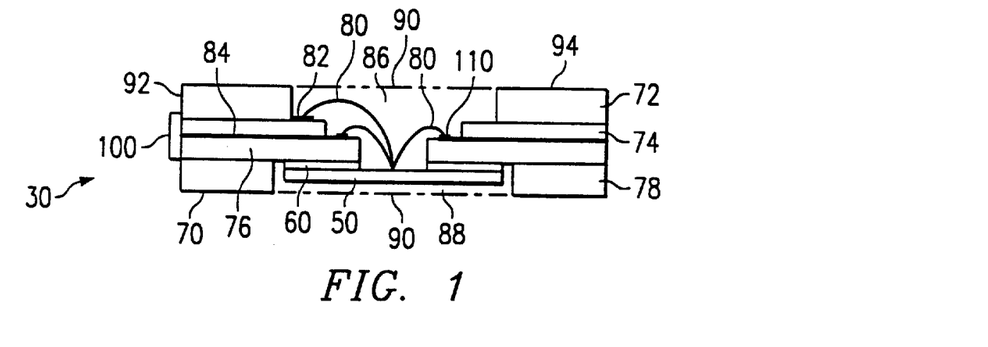
FIG. 1 is a simplified end cross-sectional view of an embodiment of a vertical integrated circuit package.

FIG. 1 is a simplified cross-sectional view of an integrated circuit package that is generally designated 30. The integrated circuit package 30 comprises a silicon chip 50, which can be, Nor example, any integrated circuit component such as a DRUM, an EPROM, a SRM, an ASIC, a FLESH or a LOGIC chip. A carrier 70 is attached to the silicon chip 50 by an adhesive layer 60. The adhesive layer 50 may be made of, for example, a double-sided adhesive polyamide tape, adhesive glue or epoxy. The carrier 70 is depicted having four layers, a top layer 72, an intermediate layer 74, an intermediate layer 76, and a bottom layer 78.

Figure 2:
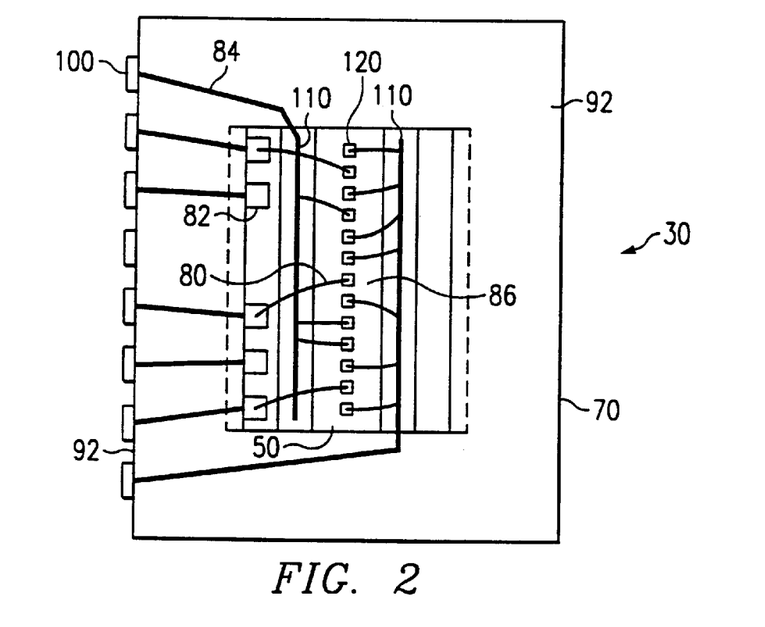
FIG. 2 is a simplified top view of a vertical integrated circuit package.

Referring collectively to FIGS. 1 and 2, intermediate layer 74 has routing strips 82 that are electrically connected through conduits 84 to side surface terminals 100 located on side surface 92. Generally, the side surface terminals 100 can have a diameter that is equal to or less than the thickness of the side surface 92. The side surface terminals 100 can be of any shape, for example, rectangular, circular or square. It should be understood by one skilled in the art that the terms "top" and "bottom" as well as the terms "side" and "end" are used for illustration purposes only, as the integrated circuit package 30 of the present invention can be assembled and used in a variety of positions and ways.

Intermediate layer 76 includes a pair of bus bars 110. The bus bars 110 are electrically connected through conduits 84 to one or more of the side surface terminals 100 on side surface 92. Side surface terminals 100 on side surface 92, function as terminal and side surface of integrated circuit package 30, and can serve to electrically connect the integrated circuit package 30 to a mother or sister-circuit board. The size of the side surface terminal 100 will depend on the thickness of the carrier 70 as side surface 92. The side surface terminals 100 are made of electrically conductive material that is suitable for creating electrical interconnects and soldering that sustains infra-red or hot-air reflow as will be known to those of skill in the art. The side surface terminals 100 are electrically connected to routing strips 82 by conduits 84.

The silicon chip SO has bonding pads 120 located generally in the central area of silicon chip 50. The bonding pads 120 are connected to routine strips 82 and bus bars 110 by wire bonding 80 to routing strips 82. The bus bars 110 may serve, for example, as power supplies or grounds, and it is preferred that one bus bar 110 serve one function, such as a power supply, and the second bus bar 110 serve another function, such as a ground.

The carrier 70 may be constructed from a material such as FR-4 which is available from, For example, Motorola Inc., U.S.A. FR-4 is an epoxy resin reinforced with a woven glass cloth. In selecting the material for carrier 70, one skilled in the art will recognize that four parameters should be considered, namely, thickness, dielectric constant, glass transition temperature and the coefficient of thermal expansion. Other materials for use with the carrier are high temperature epoxies such as FR-5 or BT-resin, available from Allied Signal, U.S.A. or Mitsubishi, Japan, which may also contain a reinforcing fiberglass mesh to increase the tensile strength of the material.

The overall thickness is dependant on the number of layers required and the amount of reinforcement used in a given layer. The reinforcing glass cloth can range in thickness from 2 mil per sheet (type 106) to about 8 mil per sheet (type 7628). The dielectric constant is determined by a combination of the resin used and the thickness and type of reinforcement used. Standard FR-4 has a dielectric constant of about 4.5. This constant can be reduced to about 3 by replacing the epoxy resin with a cyanate ester resin. The greater the thickness, however, the greater the problems associated with thickness control, rough surfaces, excessive drill wear and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for carriers having a $T_g$ above 250° C.

The coefficient of thermal expansion for FR-4 is about 16 ppm/° C. A difference in the coefficient of thermal expansion between the carrier 70 made from FR-4 and the silicon chip 50 can lead to failure of the integrated circuit package 30 during, not only the assembly of the integrated circuit package 30, but also during the use of integrated circuit package 30.

The adhesive layer 60 may be Hitachi HM122u. Alternatively, the silicon chip 50 can be adhered to the carrier 70 with a die bonding film such as HIATTACH-335 (DF-335) manufactured by Hitachi Chemical Company of Tokyo, Japan. HIATTACH-335 (DF-335) is silver filled thermosetting type resin film for die-attaching. The bonding process generally involves attaching the film on the carrier 70 at 160° C. for 5 seconds with an applied force of 1000–3000 grams; then attaching the silicon chip 50 on the film at 220° C. for 5 seconds under a force of 150–200 grams.

| DF-335 has the following properties | | | |
|---|---|---|---|
| Test | Remarks | Units | DF-335 |
| Appearance | Visual | — | silver film |
| Solid Content | 200° C.-2 h | wt % | ≧96 |
| Ash Content | 600° C.-1.5 h | wt % | 40 |
| Ash Content/Solid | 600° C.-1.5 h | wt %/solid | 42 |
| Thickness | Dial gauge | μm | 25 |
| Tensile Strength | R.T. | kgf/mm$^2$ | 7.1 |
| Tensile Modulus | R.T. | kgf/mm$^2$ | 271 |
| Die shear strength | 4 × 4 mm chip/Ag plated alloy 42 | kgf/chip | |
| R.T. | | | <10 |
| 250° C. | | | 0.9 |
| Peel strength 240° C. (after/ 85° C. 85%, 48 h) | 8 × 8 mm chip/bare alloy 42 | kgf/chip | ≧3.0 |
| Tg | TMA, 180° C.-1 h cured | ° C. | 123 |
| Modulus | Viscoelastic spectromerer | Mpa | 1300 |
| Moisture | 85° C./85% Rh, 48 h | wt % | 0.1 |

Other examples of adhesives include thermosetting adhesives, such as epoxies, polyimides and silicone. Thermoplastic adhesives that are hot-melted, in the form of sheets or as a pressure sensitive adhesive tape may also be used to adhere silicon chip 50 to the carrier 70. Commonly used are adhesive tapes based on elastomers, silicones or acrylics because of their ease of use and easy incorporation into production.

Even though FIG. 1 depicts carrier 70 as having four layers 72, 74, 76 and 78, it should be understood by one skilled in the art that carrier 70 may consist of a single layer or may be a multi-layered board having an alternate number of layers.

The above described components and their constructions and interrelation provide an assembly that is encapsulated as described below. The term "assembly" refers to the assembled components prior to encapsulation. The assembly comprises carrier 70, adhered silicon chip 50 and wire bonding 80. The carrier 70 has a top opening 86 and a cavity 88 with routing strips 82 and bus bars 110 extending into the top opening 86. The top opening 86 and the cavity 88 are open with respect to one another.

The wire bonding 80 process may begin after silicon chip 50 has been adhered to carrier 70. Silicon chip 50 and carrier 70 are then positioned on a heated pedestal to raise the temperature or the combination to a point between 100°–300° C. A gold wire having a diameter typically ranging from 0.7 to 1.3 mils is strung through a heated capillary where the temperature may range between 200°–500° C. A soldering ball is created at the end of the wire using either a flame or a spark technique. This soldering ball as then brought to bonding pad 120 on the silicon chip 50 and a combination of compression force and ultrasonic energy are used to create the desired metallurgical bond. A loop is created in the wire bonding 80 above the bond that has just been achieved, and the wire bonding 80 is routed to the desired connection on the carrier 70 such as routing strip 82 or bus bar 110 and stitch bonded. Using this "stitch" technique significantly reduces the cross-section of the wire at that point. Again, a combination of compression force and ultrasonic energy are used to create the desired metallurgical bond. This process is repeated until all the bonding pads 120 that require electrical connection on the silicon chip 50 are electrically connected to carrier 70.

Following the assembly of the above-described components, cavity 88 and top opening 86 are filled with potting material 90 as represented by the dashed line above top opening 80 and below cavity 88. The overall thickness of the combined layers 72, 74, 76 and 78 will define the thickness of the carrier as the potting material will generally be contained within the top opening 86 and cavity 88. The overall thickness of the layers 72, 74, 76 and 78 will also depend on the diameter or surface area of the side surface terminal 100.

The potting material 90 may be a cyanate ester-type resin, available from Shin-Etsu Chemical Co., Ltd., as KMC 184VA and KMC 188VA-4. Other examples of potting materials that may be used with the present invention include epoxies, polyesters, polyimides, cyanoacrylates, ceramic, silicone and urethane. The potting materials may also contain fillers that affect the coefficient of thermal expansion, as well as the is strength and flexibility of the potting material 90. The selection of potting materials and fillers will depend on the components used to make the integrated circuit package 30, as will be known to those of skill in the art.

Potting materials that may be used include those described in the table herein below. Selection of a potting material 90 will depend on the materials used in the integrated circuit package 30, as will be known by those of skill in the art.

Properties of Typical Potting Resins

|  | Epoxy | Polyester | Silicone | Urethane |
|---|---|---|---|---|
| Dielectric constant, D-150 |  |  |  |  |
| 60 Hz | 3.9 | 4.7 | 2.7 | 5.7 |
| $10^4$ Hz | 3.2 | — | 2.7 | 3.4 |
| Dissipation factor, D-150 |  |  |  |  |
| 60 Hz | 0.04 | 0.017 | 0.0001 | 0.123 |
| $10^4$ Hz | 0.03 | — | 0.0001 | 0.03 |
| Dielectric constant, D-149; V/mil | 450 | 325 | 550 | 400 |
| Volume resistivity, D-257; $\Omega \cdot cm$ | $10^{15}$ | $10^{14}$ | $10^{15}$ | $10^{13}$ |
| Arc resistance, D-495; seconds | 150 | 135 | 120 | 180 |
| Specific gravity, D-792 | 1.15 | 1.2 | 1.05 | 1.0 |
| Water absorption, D-570; % 24 h | 0.15 | 0.3 | 0.12 | 0.4 |
| Heat deflection temperature, D-648; at 264 lb/in², °F. | 380 | 260 | <70 | <70 |
| Tensile strength, D-638; lb/in² | 9000 | 10,000 | 1000 | 2000 |
| Impact strength (Izod), D-256; ft · lb/in | 0.5 | 0.3 | No break | No break |
| Coefficient of thermal expansion, D-969; $10^{-5}/°F$. | 5.5 | 7.5 | 4.0 | 15 |
| Thermal conductivity, C-177; Btu · in/ (h · ft² · °F.) | 1.7 | 1.7 | 1.5 | 1.5 |
| Linear shrinkage; % | 0.3 | 3.0 | 0.4 | 2.0 |
| Elongation, D-638; % | 3 | 3 | 175 | 300 |

Although the board-on-chip layout of integrated circuit package 30 as depicted in FIGS. 1 and 2 has been described using centralized bonding pads 120, it should be understood by one skilled in the art that the principles of the present invention are applicable to a silicon chip 50 bonding pads 120 in alternate layouts such as positioned along the sides of the silicon chip 50.

Also, it should be noted by one skilled in the art that conduits 84 and bus bars 110 may be located on a single layer of carrier 70. Generally, a layer of insulated tape or coating may be placed on the bus bars 110 to increase reliability of electrical isolation. The advantage of a multi-layer carrier 70, however, is the elimination of any need to insulate the bus bars 110. Additionally, the multi-layer carrier 70 provides a greater process margin for wire bonding.

Figure 3:
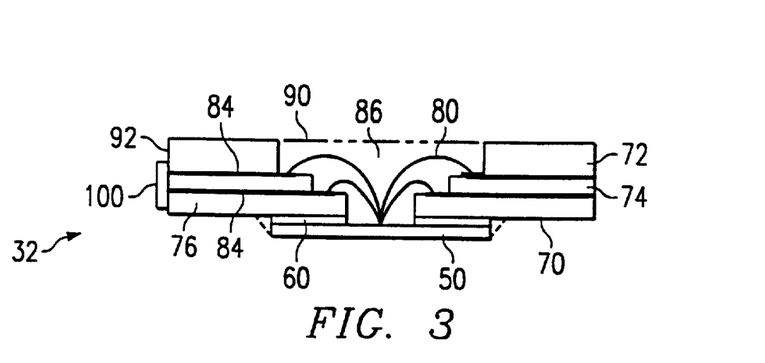
FIG. 3 is a simplified end cross-sectional view of a vertical integrated circuit package.

FIG. 3 is a simplified cross-sectional view of an integrated circuit package that is generally designated 32. The integrated circuit package 32 comprises a silicon chip 50 and a carrier 70 that is attached to the silicon chip 50 by an adhesive layer 60. In this embodiment, the carrier 70 comprises three layers, a top layer 72, an intermediate layer 74 and a bottom layer 76. Side surface 92 is a side surface of both carrier 70 and of the integrated circuit package 32.

The carrier 70 has a top opening 86, and unlike the embodiment depicted in FIG. 1 does not have a cavity 88. As best seen in conjunction with FIG. 2, routing strips 82 and bus bars 110 extend into the top opening 85. After assembly, top opening 86 is filled with potting material 90 as represented by the dashed line above top opening 86 and around silicon chip 50. Conduits 84 electrically connect side surface terminals 100 located on side surface 92.

Figure 4:
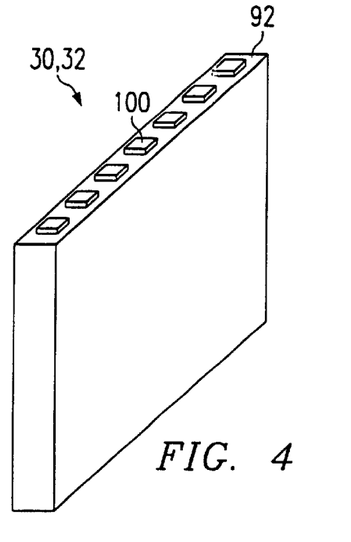
FIG. 4 is a simplified isometric view of an encapsulated vertical integrated circuit.

FIG. 4 is a simplified isometric view of an encapsulated vertical integrated circuit package 30, 32 for use in a high density vertical SIMM. The integrated circuit packages 30, 32 are shown after the entire packages have been encapsulated. The integrated circuit packages 30, 32 are electrically connected to a mother or sister-circuit board (not depicted) by side surface terminals 100 depicted on side surface 92 as squares by solder balls or columns (not depicted).

Figure 5:
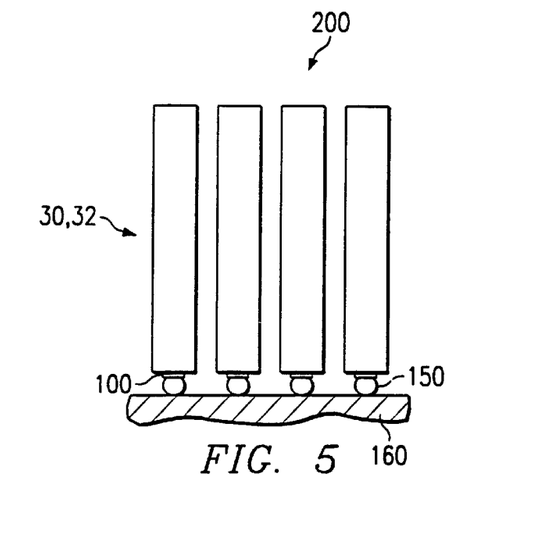
FIG. 5 is a simplified side view of an integrated circuit package SIMM.

In FIG. 5, four integrated circuit packages 30, 32 are depicted in side view as part of a vertical integrated circuit module 200. The vertical integrated circuit module 200 is formed by vertically attaching integrated circuit packages 30, 32 on a horizontal mother or sister-circuit board 160. Each integrated circuit package 30, 32 is electrically connected to the mother or sister-circuit board 160 by solder balls 150. To attach the integrated circuit packages 30, 32 to the mother or sister-circuit board 160 solder paste is preferably disposed on the mother or sister board 160 prior to infra-red or hot air reflow.

Figure 6:
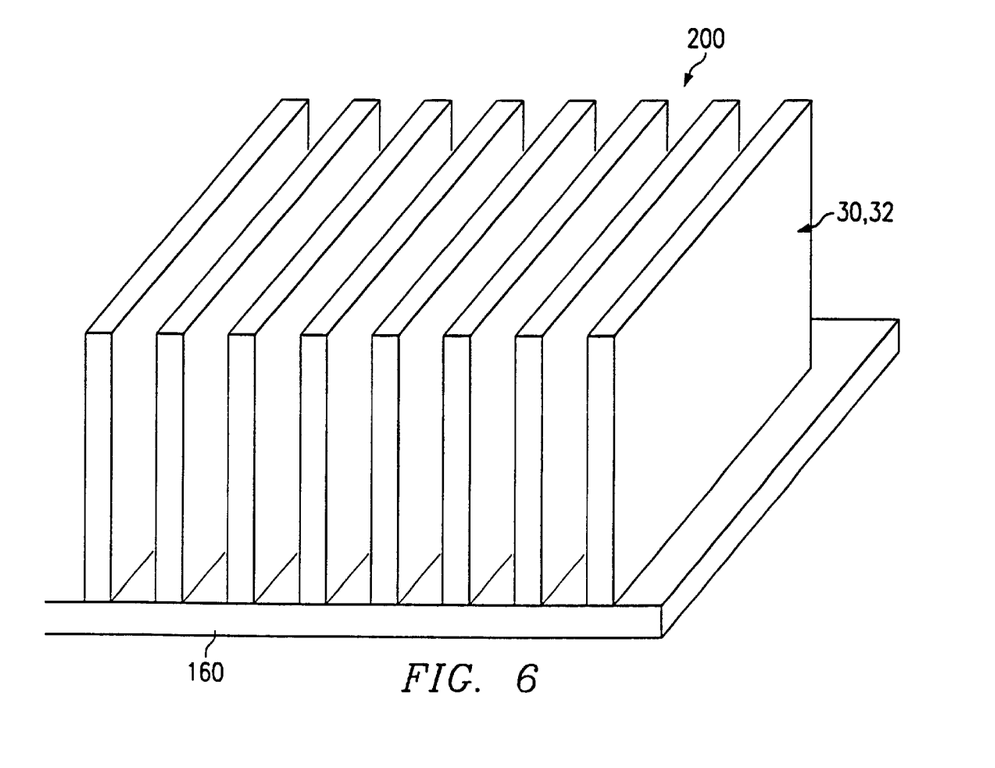
FIG. 6 is a simplified isometric view of a SIMM having vertical integrated circuit packages attached to one side thereof.

FIG. 6 is an isometric view of an embodiment of a fully assembled vertical integrated circuit module 200 of the present invention. A series of eight integrated circuit packages 30 and/or 32 are connected to a mother or sister-circuit board 160. Solder balls electrically connect the integrated circuit packages 30, 32 to the mother or sister-circuit board 160 and replace the leads used to connect conventional integrated circuit packages. The use of solder balls reduces the overall profile of the integrated circuit package 30, 32 and the integrated circuit module 200.

Figure 7:
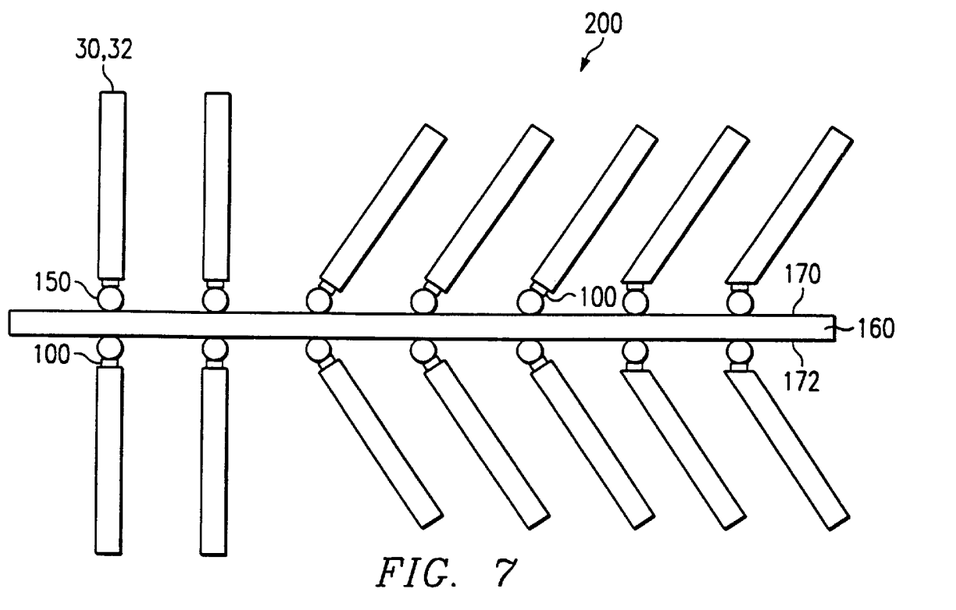
FIG. 7 is a simplified end view of a SIMM having vertical integrated circuit packages attached to both sides thereof in different configurations.

FIG. 7 is a side view of a fully assembled vertical integrated circuit module 200 having vertical integrated circuit packages 30, 32 positioned on both sides of a mother or sister board 160. A series of seven integrated circuit packages 30 and/or 32 are connected to a mother or sister-circuit board 160, and as depicted herein, the integrated circuit packages 30, 32 do not have to be completely perpendicular to the surface 170, 172 of the mother or sister-circuit board 160. In fact, the integrated circuit packages 30, 32 can be at a number of different angles, and may even differ in angles from the surface of the mother or sister-circuit board 160. Angles for use with the present invention may be anywhere from 0 to 90 degrees from the horizontal. The angle used may depend on the cooling requirements of the integrated circuit package 30, 32 and its position in relation to the ground. Because heat dissipation is affected by gravity and density considerations, i.e., heat rises, the vertical integrated circuit packages 30, 32 may be positioned so as to maximize heat dissipation.

Solder balls 150 electrically connect the integrated circuit packages 30, 32 to the mother or sister-circuit board 160 and also provide the support needed to hold the integrated circuit packages 30, 32 on the mother or sister-circuit board 160. Alternatively, other means of additional support beside the solder balls 150 may be provided to help support the integrated circuit packages 30, 32 on the mother or sister-circuit board 160.

Figure 8A:
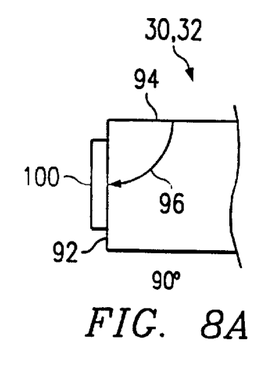
FIGS. 8a to 8c show three different configurations for the side surface 92 of integrated circuit packages 30 and 32.
Figure 8B:
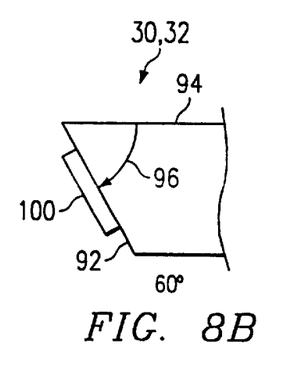
Figure 8C:
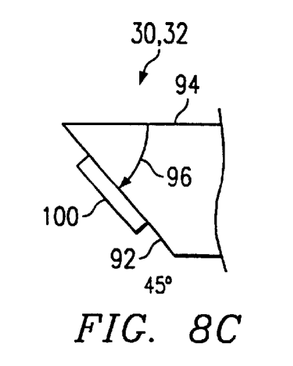

FIGS. 8a to 8c shows three different configurations for the side surface 92 integrated circuit package 30, 32. Angle 96 is shown at 90, 60 and 45 degrees as measured from the top surface 94 to the side surface 92. Depending on the size and space constraints of the integrated circuit and its operation, the angle 96 from the side surface 92 from the top surface 94 can be varied. The angle 96 will also vary depending on the cooling requirements of the integrated circuit package 30, 32. Solder balls (not depicted) can provide the electrical connection from the side surface terminals 100 to a carrier is (not shown) which can be a mother or a sister board. As can be seen in conjunction with FIG. 7, by varying the angle 96 of the side surface 96 the side surface terminals 100 and carrier 160 can be parallel. Likewise, the surface of the side surface terminal 100 does not have to be parallel to the surface of the mother or sister-circuit board 160 due to the use of solder balls 150 to connect the integrated circuit packages 30, 32 and the mother or sister-circuit board 160.

The solder balls 150 used with the present invention may be used to attach the integrated circuit packages 30, 32 to the mother or sister-circuit board 160 using conventional solder reflow systems. For example, a vapor phase solder reflow system may be used, which condenses vapor to surround the integrated circuit package 30, 32 and the mother or sister-circuit board 160 with a cloud of steam. A liquid, such as a nonchlorinated (non CFC) fluorocarbon is first heated with enough energy to form a vapor and to sustain a vapor cloud. When the integrated circuit package 30, 32 is then passed through the vapor, the vaporized liquid condenses thereon and gives off the latent heat of vaporization. This energy is then transferred to the integrated circuit package 30, 32. As long as the integrated circuit package 30, 32 remains in the vapor, the vapor continues to give off energy at a repeatable fixed rate and temperature, until the integrated circuit package 30, 32 reaches the temperature of the vapor.

The advantage of using a nonchlorinated fluorocarbon is that it is extremely thermally stable, colorless, odorless and nonflammable. In addition, it has a low toxicity, low surface temperature, low boiling point, and low heat of vaporization. Because the fluid form of the non-chlorinated fluorocarbon is inert, it does not react with fluxes or component materials, nor does it absorb oxygen or other gases that cause reactions during the solder reflow. Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the vaporization temperatures for different types of solder balls is shown below.

| Vaporization Temperatures and Solder Types | |
|---|---|
| Fluid Temperature | Solder Type |
| 56, 80, 97, 101, 102° C. and 135° C. | 100 In |
| | 37 Sn/38 Pb/25 In |
| 165° C. | 70 Sn/18 Pn/12 In |
| | 70 In/30 Pb |
| 174° C. | 60 In/40 Pb |
| 190° C. | 90 In/10 Ag |
| | 50 In/50 Pb |
| | 63 Sn/37 Pb |
| | 70 Sn/30 Pb |
| | 60 Sn/40 Pb |
| 215° C. and 230° C. | 60 Sn/40 In |
| | 60 Sn/40 Pb |
| | 63 Sn/37 Pb |
| | 70 Sn/30 Pb |
| | 62 Sn/36 Pb/2 Ag |
| 240° C. and 253° C. | 75 Pb/25 In |
| | 81 Pb/19 In |
| 260° C. and 265° C. | 96.5 Sn/3.5 Ag |

Alternatively, infrared or radiant heated solder reflow may be used. In such a system each component of the soldering system is directly exposed to radiation from a heating is element. Heat from the radiant energy element is absorbed by the different components according to its molecular structure.

Conventional radiant heat systems expose only the outer surfaces of the components to the radiant heat, which may not reach interior areas as efficiently as with vapor saturated heating methods as described above. It is, however, not generally acted by this typical problem because of the use of solder balls 150 instead of leads. In fact, due to the reduced overall size either method, vapor chase solder reflow or radiant heated solder reflow, may be effectively used with the present invention.

The present invention can also solve other problems associated with solder reflow systems. These problems include the creation or failure due to voids, coplanarity, tombstoning, open joints, component cracking, thermal shock and thermal stressing along the entire planar surface of integrated circuit packages by positioning the solder balls 150 along a vertical line rather that over a horizontal plane.

The present invention can solve these problems because it dispenses with the need for electrically connecting soldering leads to the integrated circuit package 30 and because tensile stress is directed in two dimensions, rather than three. Furthermore, by using solder balls 150 instead of leads, the problems associated with voids around pad areas or under leads caused by incomplete reflow or poor welding of the soldering surface due to improper flux or badly oxidized surfaces is eliminated. The problems or coplanarity and tombstoning are also reduced or eliminated using the solder balls 150 and the vertical connection because surface tension on both sides of the solder balls 150 is equal and because of the two-dimensional nature of the attachment between the integrated circuit packages 30, 32 and the mother or sister-circuit board 160.

Open joints are usually caused by problems with coplanarity, while cracking may occur when trapped moisture within an integrated circuit package expands as the device is heated for reflow. The increase in internal pressure, can cause the integrated circuit package to split open, usually at one of the corners. The splitting of the package can cause wire bonding from the lead frame to the silicon chip to break and in some cases the silicon chips have cracked due to the warpage at the top of the package as the temperature differentials between the top and the bottom of the device cause different rates of expansion.

Using the present invention, the only surface temperature differential that need occur is between the solder ball 150 and the carrier 70, which allows either vapor phase solder reflow or radiant heat solder reflow to be available for producing the present invention. The small size of the solder balls 150, and of the integrated circuit packages 30, 32 as a whole, allows for any of the reflow systems to be used with the because the temperature differential between the components is almost negligible. Furthermore, by selecting a potting material 90 having a coefficient of thermal expansion similar, or equal to, the coefficient of thermal expansion of the other components of the integrated circuit package 30, heat reflow effects and problems can be minimized.

In yet another embodiment of a three dimensional vertical is integrated circuit module 200, solder columns replace the leads used to connect conventional integrated circuit packages to, for example, a motherboard. The use of columns reduces the overall profile of the integrated circuit package 30 and the integrated circuit module 200.

The present invention, therefore, allows for the vertical stacking of integrated circuit packages 30, 32 into an integrated circuit module 200 that achieves an overall reduction in height. It also allows for decreased failure due to the reduced number of soldered materials having varying coefficients of thermal expansion. The present invention further allows reduction of the overall number of steps in the assembly of SIMMS by streamlining the assembly process not only in reduced number of steps, but also by elimination the curing steps associated with encapsulating integrated circuit. The present invention further allows reduction of the amount of material used in producing integrated circuit packages 30, thereby saving time, money and the environment.

Furthermore, the method of the present invention can take advantage of the side surface terminals 100 on the side surface 92 of the carrier 70 to electrically connect the integrated circuit packages 30, 32 for potting the wire bonding 80 that connect the silicon chip 50 and the carrier 70 in a single step. By filling the opening 86 with potting material 90, the wire bonding 80 between silicon chip 50 and the carrier 70 is generally protected from the environment and is particularly protected from moisture due to the hermetic nature of the encapsulation.

This means of potting the integrated circuit package 30, 32 of the present invention greatly reduces the overall profile by allowing the non-operative or backside of the silicon chip 50 to be exposed. By hermetically protecting the connections between the silicon chip 50 and the carrier 70 at the top opening 86, there is no need to completely encapsulate the entire assembly.

The problems of coplanarity are eliminated by using solder balls 150 or columns to attach the integrated circuit module 200 to the mother or sister board 160 because there are no leads that may bend and there are no deviations from the plane of the mother or sister-circuit board 160 to which the integrated circuit packages 30, 32 are being connected.

Additionally, reduced environmental impact is obtained using the method and apparatus of the present invention due to the overall decrease in the size of the integrated circuit package 30, 32 and integrated circuit module 200.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A high density electrical circuit module comprising:
    a printed circuit board having a substantially planar top surface for connection to external devices; and
    at least one said external device in the form of an integrated circuit package having a major surface and side minor surfaces extending from said major surface, at least one of said side surfaces having electrical side surface terminals thereon in intimate contact with and electrically connected to said printed circuit board at said top surface;
    wherein said module further comprises one or more integrated circuit packages electrically connected to said circuit board at the side surface terminals of said integrated circuit packages;
    wherein said integrated circuit packages comprise:
        a carrier having an opening and a side surface, and at least three routing strips being integral with said carrier and extending into said opening;
        at least three terminals disposed on said side surface, said at least three terminals disposed on said side surface being electrically connected with at least three of said routing strips;
        a chip adhered to said carrier, said chip having at least three bonding pads;
        wire bonding electrically connecting said at lest three bonding pads to said at least three routing strips; and
        potting material filling said opening.

2. The high density vertical module as recited in claim 1 wherein said integrated circuit packages further include at least one bus bar being integral with said carrier and extending into said opening, said bus bar electrically connected to said bonding pads and said terminals disposed on said side surface of said carrier.

3. A high density electrical circuit module comprising:
    a printed circuit board having a substantially planar top surface for connection to external devices; and
    at least one said external device in the form of an integrated circuit package having a major surface and side minor surfaces extending from said major surface, at least one of said side surfaces having electrical side surface terminals thereon in intimate contact with and electrically connected to said printed circuit board at said top surface;
    further comprising solder balls disposed between said integrated circuit package and said circuit board.

4. A high density electrical circuit module comprising:
    a printed circuit board having a substantially planar top surface for connection to external devices; and
    at least one said external device in the form of an integrated circuit package having a major surface and side minor surfaces extending from said major surface, at least one of said side surfaces having electrical side surface terminals thereon in intimate contact with and electrically connected to said printed circuit board at said top surface;
    further comprising solder columns disposed between said integrated circuit package and said circuit board.

5. A high density double-sided electrical circuit module comprising:

a printed circuit board having a top surface with at least one terminal and a bottom surface with at least one terminal, both surfaces adapted for connection to external devices;

a first external device in the form of an integrated circuit package having a major surface and a first side surface extending from said major surface and having thereon a first side surface terminal, said first side surface terminal of said first integrated circuit package being electrically connected to said top surface terminal of said printed circuit board through said first side surface terminal; and a second external device in the form of an integrated circuit package having a major surface and a second side surface extending from said major surface and having thereon a second side surface terminal, said second integrated circuit package being electrically connected to said bottom surface terminal of said printed circuit board through said second side surface terminal.

6. The high density double-sided module as recited in claim 5 further comprising at least three terminals being integral with said circuit board.

7. The high density double-sided module as recited in claim 5 further comprising solder balls disposed between said terminals of said integrated circuit packages and said terminals of said circuit board.

* * * * *